US008648668B2

(12) United States Patent
Lin et al.

(10) Patent No.: US 8,648,668 B2
(45) Date of Patent: Feb. 11, 2014

(54) ELECTRICAL IMPEDANCE PRECISION CONTROL OF SIGNAL TRANSMISSION LINE FOR CIRCUIT BOARD

(75) Inventors: Gwun-Jin Lin, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 477 days.

(21) Appl. No.: 13/088,506

(22) Filed: Apr. 18, 2011

(65) Prior Publication Data

US 2012/0139655 A1 Jun. 7, 2012

(30) Foreign Application Priority Data

Dec. 3, 2010 (TW) .............................. 99142166 A

(51) Int. Cl.
*H03H 7/38* (2006.01)
*H05K 1/00* (2006.01)

(52) U.S. Cl.
USPC ............ 333/125; 333/238; 174/251; 174/268

(58) Field of Classification Search
USPC .......... 333/1, 4, 5, 33, 238, 125; 174/25, 251, 174/254, 255, 256, 257, 258, 262, 268
See application file for complete search history.

(56) References Cited

U.S. PATENT DOCUMENTS

| 4,707,671 | A | * | 11/1987 | Suzuki et al. | ...................... 333/1 |
| 7,531,751 | B2 | * | 5/2009 | Hosomi et al. | ................ 174/250 |
| 7,921,403 | B2 | * | 4/2011 | Dangler et al. | ................ 716/137 |
| 2009/0107710 | A1 | * | 4/2009 | Goergen | ....................... 174/258 |

* cited by examiner

*Primary Examiner* — Stephen Jones
(74) *Attorney, Agent, or Firm* — Rosenberg, Klein & Lee

(57) ABSTRACT

Disclosed is a structure for precision control of electrical impedance of signal transmission circuit board. A substrate forms thereon a plurality of first signal transmission lines, and a first covering insulation layer is formed on a first surface of the substrate to cover a surface of each first signal transmission lines and each spacing section formed between adjacent first signal transmission lines. Each first signal transmission lines can transmit a differential mode signal or a common mode signal. At least one first flattening insulation layer is formed between a surface of the first covering insulation layer and a first conductive shielding layer so that the first flattening insulation layer fills up the height difference between the surface of each first signal transmission line and the spacing section associated with each first signal transmission line to thereby ensure a consistent distance between the signal transmission lines and the conductive shielding layer for realizing precision control of electrical impedance of the signal transmission circuit board.

15 Claims, 5 Drawing Sheets

ELECTRICAL IMPEDANCE PRECISION CONTROL OF SIGNAL TRANSMISSION LINE FOR CIRCUIT BOARD

FIELD OF THE INVENTION

The present invention relates to a structural design for electrical impedance of flexible circuit board, and in particular to a structural design of flexible circuit board for realizing precision control of electrical impedance of circuit boards or flexible flat cables.

BACKGROUND OF THE INVENTION

Various electronic devices use electrical circuit boards or flexible flat cables to arrange, position, and mount electrical parts and connectors, and to transmit electrical signals to desired destination functional elements. Manufacturing of circuit boards is often conducted by laying signal transmission traces, through wiring technology, on a surface of a substrate. The commonly known circuit boards are generally classified as rigid circuit boards and flexible circuit boards or flat cables.

Taking a flexible flat cable that is commonly used in various electronic products, such as notebook computers, personal digital assistants, and mobile phones as an example, the flexible flat cable has such a structure that a number of conductors that are each covered by an insulation layer are arrange to juxtapose each other to form a flat structure that may be combined with an electrical connector or circuit soldering to realize transmission of electronic signals.

FIGS. 1 and 2 respectively show a schematic plan view and a cross-sectional view of a conventional circuit board. As shown in the drawings, a substrate 1 has a first surface 11 and a second surface 12. The substrate 1 extends in an extension direction to form a free end on which a plurality of conductive contacts 13 is formed. The substrate 1 may be inserted, with the free end thereof, into an insertion slot 15 formed on a circuit substrate 14 to allow the conductive contacts 13 to electrically engage corresponding contacts formed in the insertion slot 15.

The first surface 11 of the substrate 1 forms a plurality of parallel and spaced signal transmission lines 2 that extends a predetermined length. Adjacent signal transmission lines 2 on the first surface 11 of the substrate 1 are spaced from each other by a predetermined distance d, whereby the first surface 11 of the substrate 1 forms a plurality of wiring sections A1 that are respectively covered by the signal transmission lines 2 and a plurality of spacing zones A1 that are not covered by the signal transmission lines 2. A covering insulation layer 3 is formed on the first surface 11 of the substrate 1 to cover the surface of each signal transmission line 2 and each spacing section A2. A conductive shielding layer 4 is further formed to cover a surface of the covering insulation layer 3. The conductive shielding layer is often connected to system grounding to improve shielding performance and also to serve as a grounding surface for electrical impedance.

Both rigid circuit board and flexible circuit board are structured by laying a number of signal transmission lines 2 on a surface of a substrate 1. The signal transmission lines 2, although having a very small thickness, make the surface of the covering insulation layer 3 that is formed on the first surface 11 of the substrate 1 showing a corrugated wavy configuration and is thus irregular. Consequently, the conductive shielding layer 4 that is formed on the surface of the covering insulation layer 3 shows an irregular surface and wavy configuration as shown in FIG. 2.

Due to such a structural arrangement, the electrical impedance of each signal transmission line of the circuit board may be varied, making it hard to control the precision of the electrical impedance.

In a practical application, such a circuit board may cause certain problems, including poor impedance matching, signal reflection, radiation of electromagnetic wave, loss or missing of signal in signal receiving, and deformation of signal waveform. These problems cause sever influence on the circuit boards that are used in high precision electronic equipments.

This is especially problematic for electronic devices that are operated with high working frequency, such as notebook computers. Due to the high working frequency, the requirement for precision of impedance is severe. The conventional circuit boards that are manufactured with the conventional technology do not meet the needs of the industry. For flexible circuit board or flat cable, due to being made thin and flexible, the insulation layer is often formed of a coverlay and this makes corrugated configuration more severe and it is even harder to realize precision of electrical impedance.

SUMMARY OF THE INVENTION

Thus, an objective of the present invention is to provide a structure of flexible circuit board that allows for precision control of electrical impedance of the flexible circuit board, especially for flexible circuit board or flat cable that is thin and flexible.

Another objective of the present invention is to provide a circuit board having a flat insulation structure to as to provide a constant spacing distance between signal transmission lines and a conductive shielding layer and thus improve precision of electrical impedance of the circuit board.

To achieve the above objectives, in the structure of a circuit substrate, at least one first flat insulation layer is formed between a surface of a first covering insulation layer and a first conductive shielding layer. The first flat insulation layer fills up the height difference between the surface of first signal transmission lines and spacing zones between the first signal transmission lines to achieve precision control of electrical impedance of the flexible circuit board.

As to the effectiveness of the present invention, the present invention provides a structure for electrical impedance precision control of signal transmission line for circuit board, wherein a regular flat surface is formed by applying a flattening technology and structure after first signal transmission lines and a first covering insulation layer are formed on a surface of a substrate, so that no corrugated wavy structure may be found on the surface. As a result, a flat surface of first conductive shielding layer can be obtained after the first conductive shielding layer is applied to the surface of the first covering insulation layer. As such, excellent precision control of electrical impedance can be obtained for each first signal transmission line on the circuit board and drawbacks in connection with poor impedance matching, signal reflection, radiation of electromagnetic wave, and loss or missing of signal in signal receiving and transmission, and deformation of signal waveform that are often found in the existing devices can be eliminated.

For applications associated with flexible circuit boards, with the selection of proper flattening material and thickness thereof, as well as the selection of proper thin substrate, the flexibility of the flexible circuit board can be improved and the precision control of electrical impedance can be remarkably improved, such as being improved from $100\Omega \pm 15\Omega$ to $100\Omega \pm 5\Omega$, thereby providing better practical value.

Further, in regard to structural features, since each layer of a circuit board shows a consistent flattened structure, when the material used is made thinner, which requires the conductive shielding layer must be perforated to increase the electrical impedance, especially when perforation is made in a sliver paste coating, burring (serration like structure) is not like to occur in an edge of a hole, whereby the influence caused by burring that occurs in the formation of holes on the control of electrical impedance can be reduced to ensure the realization of precision control of electrical impedance.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
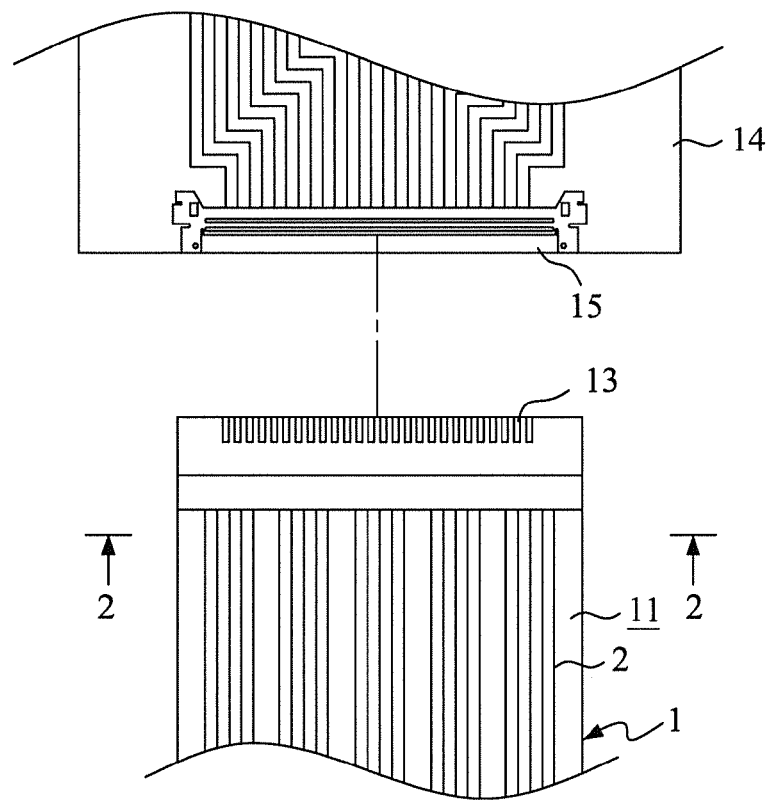
FIG. 1 is a schematic view showing a conventional flexible circuit board.
Figure 2:
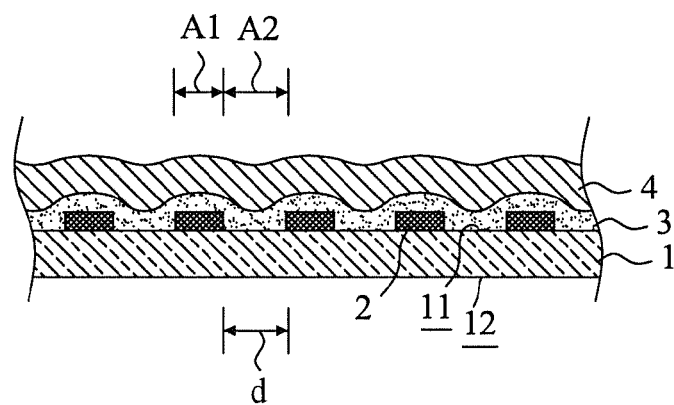
FIG. 2 is a cross-sectional view taken along line 2-2 of FIG. 1.
Figure 3:
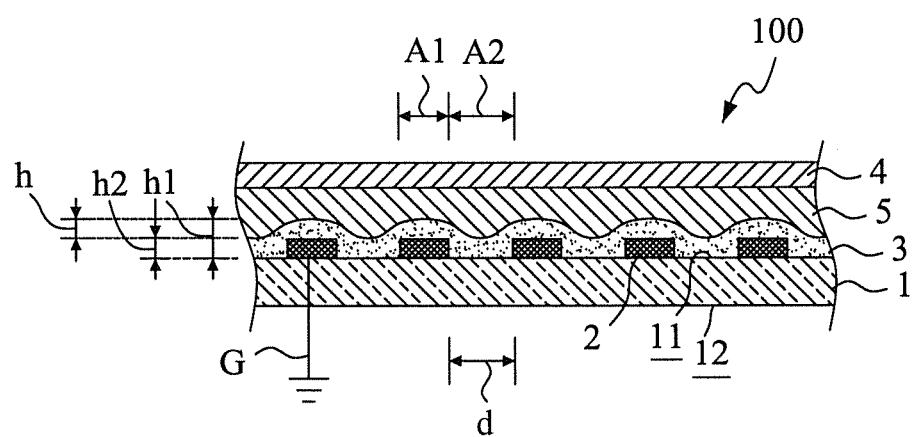
FIG. 3 is a cross-sectional view showing a first embodiment according to the present invention.

With reference to the drawings and in particular to FIG. 3, which is a cross-sectional view showing a first embodiment according to the present invention, as shown in the drawing, a substrate 1 has a first surface 11 and a second surface 12. The first surface 11 of the substrate 1 forms a plurality of parallel and spaced first signal transmission lines 2. The substrate 1 is preferably a flexible substrate, but can alternatively be a rigid substrate or other types of substrate (such as combined flexible and rigid board), and the substrate 1 can be a single-sided boards, double-sided board, or multiple-layered board.

The first signal transmission lines 2 are made of copper foil or a composite material and have a cross-sectional shape of rectangle, trapezoid, circle, ellipse, or other shapes. For the common practical etching process of circuit boards, the cross-sectional shape is generally rectangular or trapezoid, and for electronic flat cables, the cross-sectional shape can be rectangular or circular. Depending upon the application of the first signal transmission lines 2, the first signal transmission lines 2 may transmit differential mode signals or common mode signals. The first signal transmission lines 2 may be provided with at least one grounding path that is connected to ground potential G.

The first signal transmission lines 2 are spaced from each other by a predetermined distance d, so that the first surface 11 of the substrate 1 forms a plurality of wiring sections A1 that are respectively covered by the first signal transmission lines 2 and a plurality of spacing sections A2 that are not covered by the first signal transmission lines 2.

A first covering insulation layer 3 is formed on the first surface 11 of the substrate 1 and covers a surface of each of the first signal transmission lines 2 and each of the spacing sections A2. The first covering insulation layer 3 is generally made of an insulation material, or a bonding sheet, cover layer, or ink.

The surface of the first covering insulation layer 3 has a first height h1 for a portion thereof corresponding to the wiring sections A1, and the surface of the first covering insulation layer 3 has a second height h2 for a portion thereof corresponding to the spacing sections A2. The first height h1 and the second height h2 has a height difference h therebetween.

In the structure according to the present invention, a first flattening insulation layer 5 is formed on the surface of the first covering insulation layer 3, and a first conductive shielding layer 4 is formed on a surface of the first flattening insulation layer 5. The first flattening insulation layer 5 fills up the height difference h between the first height h1 and the second height h2, so that a substantially consistent height is formed between an undersurface of the first conductive shielding layer 4 and the wiring sections A1 and between the undersurface and the spacing sections A2. In other words, in the structure of the present invention, a first flattening insulation layer 5 is provided between the surface of the first covering insulation layer 3 and the first conductive shielding layer 4. The material that makes the first conductive shielding layer 4 can be silver based material, or an equivalent conductive layer, such as aluminum based material layer, copper based material layer, conductive carbon paste, and a conductive particle contained resin layer.

The substrate 1, the first signal transmission lines 2, the first covering insulation layer 3, the first flattening insulation layer 5, and the first conductive shielding layer 4 collectively form a single-sided signal transmission circuit board 100.

The first flattening insulation layer 5 can be formed with any known process, such as ink printing, coating, and roll-coating. The first flattening insulation layer 5 can be made of an insulation material or a polymer material. A preferred embodiment of the first flattening insulation layer 5 comprises applying a liquid material by means of ink printing, coating, or roll coating on a surface of the first covering insulation layer 3, followed by heating or irradiating ultraviolet ray to cure and fix the liquid material on the surface of the first covering insulation layer 3. The first flattening insulation layer 5 can be formed on the whole surface of the first covering insulation layer 3, or the first flattening insulation layer 5 can be selectively formed on local areas where control of precision of electrical impedance is desired.

With the formation of the first flattening insulation layer 5 between the surface of the first covering insulation layer 3 and the first conductive shielding layer 4, both upper and lower surfaces of the first conductive shielding layer 4 are of a flat and completely regular surface structure. Thus, the first conductive shielding layer 4 shows a consistent height with respect to the wiring sections A1 of the first signal transmission lines 2 and the spacing sections A2 between the first signal transmission lines 2, meaning the electrical impedances of the first signal transmission lines 2 are not varied with respect to each other due to the difference in height, whereby precision control of electrical impedance for signal transmission circuit board, especially flexible circuit board or flexible flat cable, can be realized.

In a practical application, for signals transmitted through the first signal transmission lines 2, either differential mode signal or common mode signal, due to the consistence of precision of electrical impedance, the performance and reliability of signal transmission are both excellent.

Figure 4:
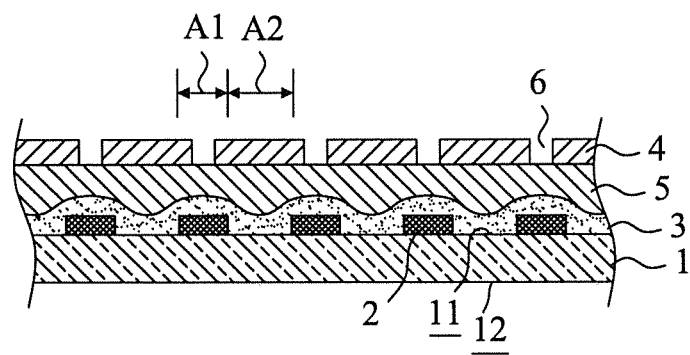
FIG. 4 is a cross-sectional view showing a second embodiment according to the present invention.
Figure 5:
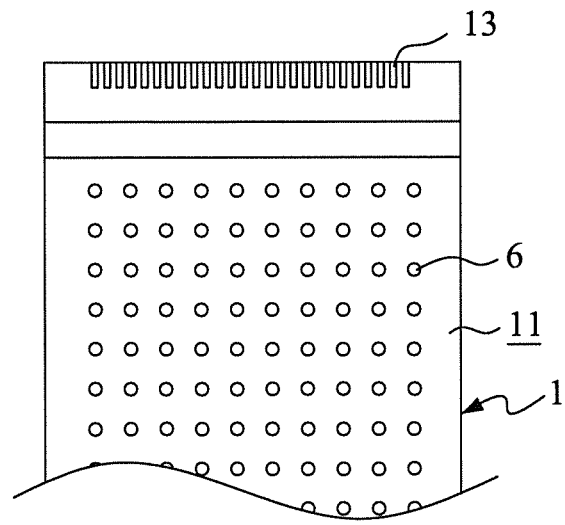
FIG. 5 is a top plan view of the second embodiment of the present invention shown in FIG. 4.

Referring to FIG. 4, a cross-sectional view of a second embodiment according to the present invention is shown. The instant embodiment is substantially identical to the first embodiment and similar or identical parts/components bear the same reference numerals. The difference is that in the instant embodiment, the first conductive shielding layer 4 forms a perforation structure 6 (also see top plan view shown in FIG. 5) selectively of various pattern, whereby the electrical impedance of the first signal transmission lines 2 can be adjusted. The perforation structure 6 can be formed of circular holes, square holes, rhombus holes, or holes of other shapes and the size and distribution of the perforation structure can be adjusted to fit the need for desired electrical impedance.

Figure 6:
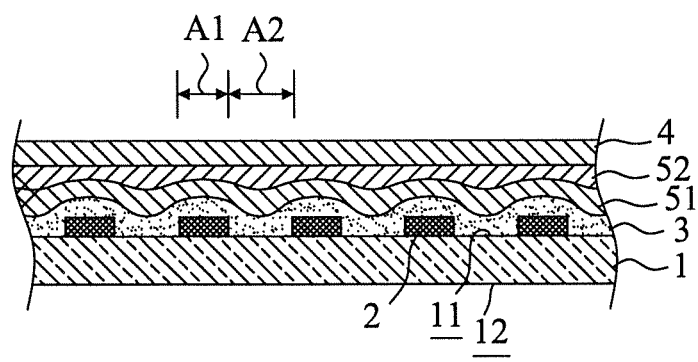
FIG. 6 is a cross-sectional view showing a third embodiment according to the present invention.

Referring to FIG. 6, a cross-sectional view of a third embodiment according to the present invention is shown. The instant embodiment is substantially identical to the first embodiment and the difference is that more than two first flattening insulation layers 51, 52 are formed between the surface of the first covering insulation layer 3 and the first conductive shielding layer 4. The number of the first flattening insulation layers 51, 52 can be changed according to the spacing distance and the material of the first signal transmission lines 2 and the thickness and performance of the first flattening insulation layers. With the formation of the first flattening insulation layers 51, 52 on the surface of the first covering insulation layer 3, a flattened configuration can be achieved and more precise control of electrical impedance can be realized.

Figure 7:
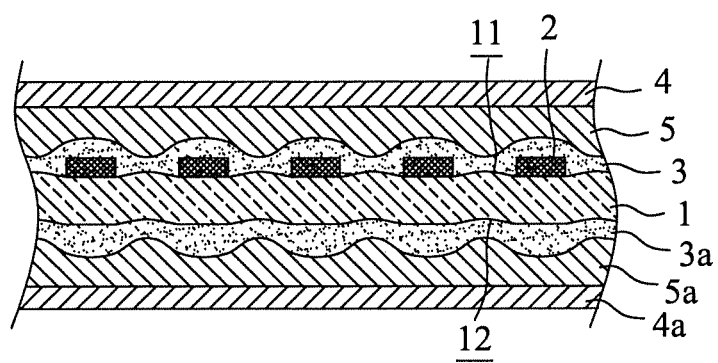
FIG. 7 is a cross-sectional view showing a fourth embodiment according to the present invention.

FIG. 7 shows a cross-sectional view of a fourth embodiment according to the present invention. The instant embodiment is substantially identical to the first embodiment shown in FIG. 3 and the difference is that the second surface 12 of the substrate 1 comprises an irregular, corrugated second covering insulation layer 3a formed thereon, at least one second flattening insulation layer 5a formed on an undersurface of the second covering insulation layer 3a, and a second conductive shielding layer 4a formed on an undersurface of the second flattening insulation layer 5a. In other words, FIG. 7 provides an example where the technology of the present invention is applied to a substrate of which one surface forms signal transmission lines. In practical applications, the second flattening insulation layer 5a may alternatively directly formed on the second surface 12 of the substrate 1 with the second covering insulation layer 3a being omitted.

Figure 8:
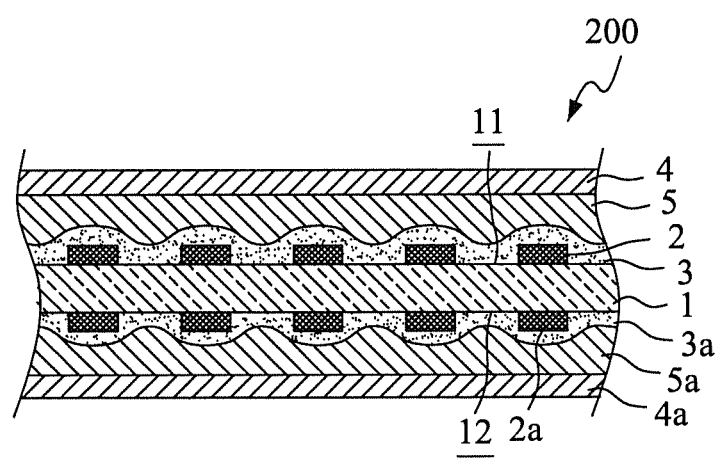
FIG. 8 is a cross-sectional view showing a fifth embodiment according to the present invention.

FIG. 8 shows a cross-sectional view of a fifth embodiment according to the present invention. The instant embodiment is substantially identical to the fourth embodiment shown in FIG. 7 and the difference is that the second surface 12 of the substrate 1 forms a plurality of spaced second signal transmission lines 2a, and then, sequentially, the second covering insulation layer 3a, the second flattening insulation layer 5a, and the second conductive shielding layer 4a are formed. In other words, FIG. 8 provides an example where the technology of the present invention is applied to a substrate of which two surfaces form signal transmission lines.

The substrate 1, the first signal transmission lines 2, the first covering insulation layer 3, the first flattening insulation layer 5, the first conductive shielding layer 4, the second signal transmission lines 2a, the second covering insulation layer 3a, the second conductive shielding layer 4a, the second flattening insulation layer 5a collectively form a double-sided signal transmission circuit board 200.

Figure 9:
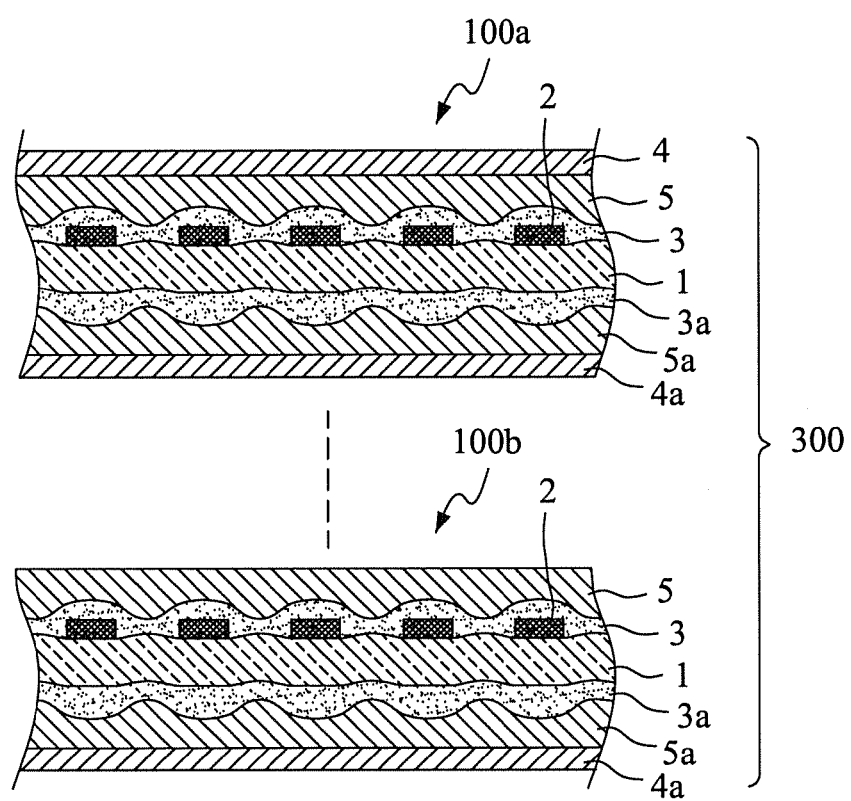
FIG. 9 is a cross-sectional view showing a sixth embodiment according to the present invention.

FIG. 9 shows a cross-sectional view of a sixth embodiment according to the present invention. The instant embodiment provides a multiple-ply-stacked signal transmission circuit board based on the embodiment shown in FIG. 7. For example, a two-ply-stacked structure is shown, wherein a first signal transmission circuit board 100a comprises a substrate 1, first signal transmission lines 2, a first covering insulation layer 3, a first conductive shielding layer 4, a first flattening insulation layer 5, a second covering insulation layer 3a, a second conductive shielding layer 4a, and a second flattening insulation layer 5a. And similarly, a second signal transmission circuit board 100b comprises a substrate 1, first signal transmission lines 2, a first covering insulation layer 3, a first conductive shielding layer 4, a first flattening insulation layer 5, a second covering insulation layer 3a, a second conductive shielding layer 4a, and a second flattening insulation layer 5a. The first signal transmission circuit board 100a and the second signal transmission circuit board 100b are stacked vertically to form the multiple-pl-stacked signal transmission circuit board featuring precision control of electrical impedance. The first signal transmission circuit board 100a and the second signal transmission circuit board 100b together form a stacked structure 300.

Various modified arrangements according to the present invention can be used in applications, such as:

(1) A stacked structure having multiple single-sided signal transmission circuit boards can be formed by stacking at least two single-sided signal transmission circuit boards.

(2) A stacked structure having multiple double-sided signal transmission circuit boards can be formed by stacking at least two double-sided signal transmission circuit boards.

(3) A stacked structure can be formed by stacking at least one single-sided signal transmission circuit board and at least one double-sided signal transmission circuit board.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A structure for precision control of electrical impedance of signal transmission circuit board, comprising:
    a substrate, which has a first surface and a second surface;
    a plurality of first signal transmission lines, which is formed on the first surface of the substrate, the first signal transmission lines being spaced from each other by a predetermined distance to form a plurality of wiring sections that are covered by the first signal transmission lines and a plurality of spacing sections that are not covered by the first signal transmission lines on the first surface of the substrate;
    a first covering insulation layer, which is formed on the first surface of the substrate and covers a surface of each of the first signal transmission lines and each of the spacing sections, the first covering insulation layer having a surface that forms a first height at a portion thereof corresponding to the wiring sections, the surface of the first covering insulation layer forming a second height at a portion thereof corresponding to the spacing sections, the first height and the second height forming a height difference therebetween; and
    a first conductive shielding layer, which is formed on a surface of the first covering insulation layer;
    characterized in that a first flattening insulation layer is formed between the surface of the first covering insulation layer and the first conductive shielding layer, the first flattening insulation layer filling up the height difference, so that the first conductive shielding layer shows a substantially consistent height with respect to both the wiring sections of the substrate and the spacing sections of the substrate, wherein the substrate, the first signal transmission lines, the first covering insulation layer, the first flattening insulation layer, and the first conductive shielding layer collectively form a single-sided signal transmission circuit board.

2. The structure for precision control of electrical impedance of signal transmission circuit board as claimed in claim 1, wherein the first conductive shielding layer is formed of one of a silver based material layer, an aluminum based material layer, a copper based material layer, a conductive carbon paste, and a conductive particle contained resin layer.

3. The structure for precision control of electrical impedance of signal transmission circuit board as claimed in claim 1, wherein the first conductive shielding layer forms a substantially completely flat surface structure.

4. The structure for precision control of electrical impedance of signal transmission circuit board as claimed in claim 1, wherein the first conductive shielding layer comprises a plurality of perforation structures.

5. The structure for precision control of electrical impedance of signal transmission circuit board as claimed in claim 1, wherein the signal transmission lines are of a cross-sectional shape of one of rectangle, trapezoid, circle, and ellipse.

6. The structure for precision control of electrical impedance of signal transmission circuit board as claimed in claim 1, wherein each of the first signal transmission lines transmits a signal of one of differential mode signal and common mode signal.

7. The structure for precision control of electrical impedance of signal transmission circuit board as claimed in claim 1, wherein the first flattening insulation layer is formed by means of one of ink printing, coating, and roll coating.

8. The structure for precision control of electrical impedance of signal transmission circuit board as claimed in claim 1, wherein the covering insulation layer is made of one of a cover layer, a bonding sheet, or an insulation ink.

9. The structure for precision control of electrical impedance of signal transmission circuit board as claimed in claim 1, wherein the substrate comprises one of a flexible substrate and a rigid substrate.

10. The structure for precision control of electrical impedance of signal transmission circuit board as claimed in claim 1, at least two single-sided signal transmission circuit boards being stacked to form a stacked structure having multiple single-sided signal transmission circuit boards.

11. The structure for precision control of electrical impedance of signal transmission circuit board as claimed in claim 1 further comprising:
at least one second flattening insulation layer, which is formed on the second surface of the substrate; and
a second conductive shielding layer, which is formed on a surface of the second flattening insulation layer.

12. The structure for precision control of electrical impedance of signal transmission circuit board as claimed in claim 11, wherein a second covering insulation layer is formed between the second flattening insulation layer and the second surface of the substrate.

13. The structure for precision control of electrical impedance of signal transmission circuit board as claimed in claim 1, wherein the single-sided signal transmission circuit board further comprises:
a plurality of second signal transmission lines, which is formed on the second surface of the substrate, the second signal transmission lines being spaced from each other by a predetermined distance to form a plurality of wiring sections that are covered by the second signal transmission lines and a plurality of spacing sections that are not covered by the second signal transmission lines on the second surface of the substrate;
a second covering insulation layer, which is formed on the second surface of the substrate and covers a surface of each of the second signal transmission lines and each of the spacing sections, the second covering insulation layer having a surface that forms a first height at a portion thereof corresponding to the wiring sections, the surface of the second covering insulation layer forming a second height at a portion thereof corresponding to the spacing sections, the first height and the second height forming a height difference therebetween;
at least one second flattening insulation layer, which is formed on the surface of the second covering insulation layer; and
a second conductive shielding layer, which is formed on a surface of the second flattening insulation layer;
wherein the substrate, the second signal transmission lines, the second covering insulation layer, the second flattening insulation layer, the second conductive shielding layer, the first signal transmission lines, the first covering insulation layer, the first flattening insulation layer, and the first conductive shielding layer collectively form a double-sided signal transmission circuit board.

14. The structure for precision control of electrical impedance of signal transmission circuit board as claimed in claim 13, at least two double-sided signal transmission circuit boards being stacked to form a stacked structure having multiple double-sided signal transmission circuit boards.

15. The structure for precision control of electrical impedance of signal transmission circuit board as claimed in claim 13, at least one single-sided signal transmission circuit board and at least one double-sided signal transmission circuit board being stacked to form a stacked structure.

\* \* \* \* \*